United States Patent
O'Dougherty et al.

(10) Patent No.: US 7,702,418 B2
(45) Date of Patent: *Apr. 20, 2010

(54) SECURE READER SYSTEM

(75) Inventors: Kevin T. O'Dougherty, Arden Hills, MN (US); Robert E. Andrews, Hudson, MA (US); Tripunithura V. Jayaraman, North Kingstown, RI (US); Joseph P. Menning, Prior Lake, MN (US); Christopher A. Baye-Wallace, Anoka, MN (US)

(73) Assignee: Advanced Technology Materials, Inc., Danbury, CT (US)

( * ) Notice: Subject to any disclaimer, the term of this patent is extended or adjusted under 35 U.S.C. 154(b) by 744 days.

This patent is subject to a terminal disclaimer.

(21) Appl. No.: 10/742,125

(22) Filed: Dec. 19, 2003

(65) Prior Publication Data

US 2004/0172160 A1 Sep. 2, 2004

(51) Int. Cl.
G06F 17/00 (2006.01)

(52) U.S. Cl. ............ 700/231; 700/239; 700/244; 700/265; 700/266; 700/281; 73/866.5

(58) Field of Classification Search ............ 700/105, 700/110, 230, 231, 239, 244, 265–273, 281–285; 73/866.5; 174/47; 137/177, 251.1, 798; 455/66; 324/637, 639, 663; 702/45–55; 340/618, 620, 572.1–572.9
See application file for complete search history.

(56) References Cited

U.S. PATENT DOCUMENTS 4,951,512 A 8/1990 Mazza et al.
5,014,208 A * 5/1991 Wolfson ............ 700/99
5,102,010 A * 4/1992 Osgar et al. ............ 222/1
5,223,796 A * 6/1993 Waldman et al. ............ 324/687
5,385,060 A 1/1995 Wang
5,524,794 A 6/1996 Benedetti, Jr. et al. . 222/153.14
5,539,188 A 7/1996 Fallah et al. ............ 235/375
5,558,083 A 9/1996 Bathe et al. ............ 128/203.12
5,594,162 A 1/1997 Dolan et al.
5,604,681 A * 2/1997 Koeninger ............ 700/285
5,627,517 A * 5/1997 Theimer et al. ............ 340/572.1
5,635,652 A 6/1997 Beaudin
5,638,285 A 6/1997 Newton ............ 364/479.11

(Continued)

FOREIGN PATENT DOCUMENTS

| JP | 2002-181296 A | 6/2002 |
| JP | 2003-139864 A | 5/2003 |
| WO | WO 00/54724 A2 | 9/2000 |

OTHER PUBLICATIONS

Philips Semiconductort, mifare System Overview, Dec. 1998.

(Continued)

*Primary Examiner*—Jeffrey A Shapiro
(74) *Attorney, Agent, or Firm*—Vincent K. Gustafson; Intellectual Property/Technology Law; Maggie Chappuis

(57) ABSTRACT

A secure reader system (SRS) for containers housing material to be employed in an application. A container is provided having an information storing mechanism. A connector of the SRS having a reader is provided to physically couple to the container for periodically reading information there from. The connector is configured to physically couple to the container and may draw material from the container simultaneous with the reading.

28 Claims, 7 Drawing Sheets

U.S. PATENT DOCUMENTS

| | | | |
|---|---|---|---|
| 5,651,402 A | 7/1997 | McCaul | |
| 5,737,221 A | 4/1998 | Newton | 364/424.07 |
| 5,744,696 A | 4/1998 | Wang et al. | |
| 5,802,859 A | 9/1998 | Zugibe | |
| 5,803,673 A | 9/1998 | Reinsch et al. | 406/31 |
| 5,852,590 A | 12/1998 | De La Huerga | |
| 5,875,921 A | 3/1999 | Osgar et al. | 222/1 |
| 5,883,376 A | 3/1999 | Rosch et al. | 235/375 |
| 5,893,263 A | 4/1999 | Matsumoto et al. | |
| 5,940,780 A | 8/1999 | Azar et al. | |
| 5,942,980 A | 8/1999 | Hoben et al. | |
| 5,949,049 A | 9/1999 | McCarrick et al. | 235/375 |
| 5,953,682 A | 9/1999 | McCarrick et al. | 235/375 |
| 5,955,684 A | 9/1999 | Gravel et al. | |
| 6,065,638 A | 5/2000 | Terranova et al. | |
| 6,067,844 A | 5/2000 | Westbrook et al. | |
| 6,140,146 A | 10/2000 | Brady et al. | |
| 6,147,662 A | 11/2000 | Grabau et al. | |
| 6,161,706 A | 12/2000 | McCord | 211/85.18 |
| 6,165,347 A | 12/2000 | Warburton | |
| 6,206,240 B1 * | 3/2001 | Osgar et al. | 222/39 |
| 6,209,592 B1 | 4/2001 | Gilboa et al. | |
| 6,234,006 B1 | 5/2001 | Sunshine et al. | |
| 6,271,753 B1 | 8/2001 | Shukla | |
| 6,275,746 B1 | 8/2001 | Leatherman et al. | |
| 6,281,787 B1 | 8/2001 | Lerg et al. | |
| 6,282,458 B1 | 8/2001 | Murayama et al. | 422/108 |
| 6,318,568 B1 | 11/2001 | McCord | 211/85.18 |
| 6,405,745 B1 | 6/2002 | Kar et al. | 137/2 |
| 6,446,644 B1 * | 9/2002 | Dolechek | 134/57 R |
| 6,516,249 B1 | 2/2003 | Hoyle et al. | |
| 6,524,774 B1 | 2/2003 | Sonderman | |
| 6,542,848 B1 | 4/2003 | Neeser et al. | |
| 6,545,592 B2 | 4/2003 | Weiner | |
| 6,556,027 B2 | 4/2003 | Banks | |
| 6,556,832 B1 | 4/2003 | Soliman | |
| 6,556,889 B2 | 4/2003 | Rudick et al. | |
| 6,556,949 B1 | 4/2003 | Lyon | |
| 6,558,620 B1 | 5/2003 | Sanford et al. | |
| 6,571,151 B1 | 5/2003 | Leatherman | |
| 6,592,043 B1 | 7/2003 | Britton | |
| 6,597,175 B1 | 7/2003 | Brisco | |
| 6,618,714 B1 | 9/2003 | Abrahams | |
| 6,633,796 B1 | 10/2003 | Pool et al. | |
| 6,642,897 B2 * | 11/2003 | Forster et al. | 343/767 |
| 6,649,829 B2 | 11/2003 | Garber et al. | |
| 6,672,341 B2 | 1/2004 | Bartholomew et al. | |
| 6,720,866 B1 * | 4/2004 | Sorrells et al. | 340/10.4 |
| 6,732,945 B2 * | 5/2004 | Dolechek | 239/65 |
| 6,843,414 B2 * | 1/2005 | Madrid et al. | 235/385 |
| 6,879,876 B2 * | 4/2005 | O'Dougherty et al. | 700/231 |
| 7,061,831 B2 | 6/2006 | De La Huerga | |
| 2001/0052465 A1 | 12/2001 | Dordi et al. | |
| 2002/0078363 A1 | 6/2002 | Hill et al. | |
| 2002/0189667 A1 | 12/2002 | O'Dougherty et al. | |
| 2003/0004608 A1 | 1/2003 | O'Dougherty et al. | |
| 2005/0177274 A1 * | 8/2005 | O'Dougherty et al. | 700/231 |

OTHER PUBLICATIONS

Philips Semiconductor, Controllers for High Security, Crypto and Dual Interface Smart Cards, Mar. 1999.

Bob Lorefice, et al., Semiconductor International, pp. 1-9, "How to Minimize Resist Usage . . . "(2003).

U.S. Appl. No. 10/139,185, filed May 3, 2002, Chilcoate, et al.

U.S. Appl. No. 10/139,186, filed May 3, 2002, Wertenberger.

* cited by examiner

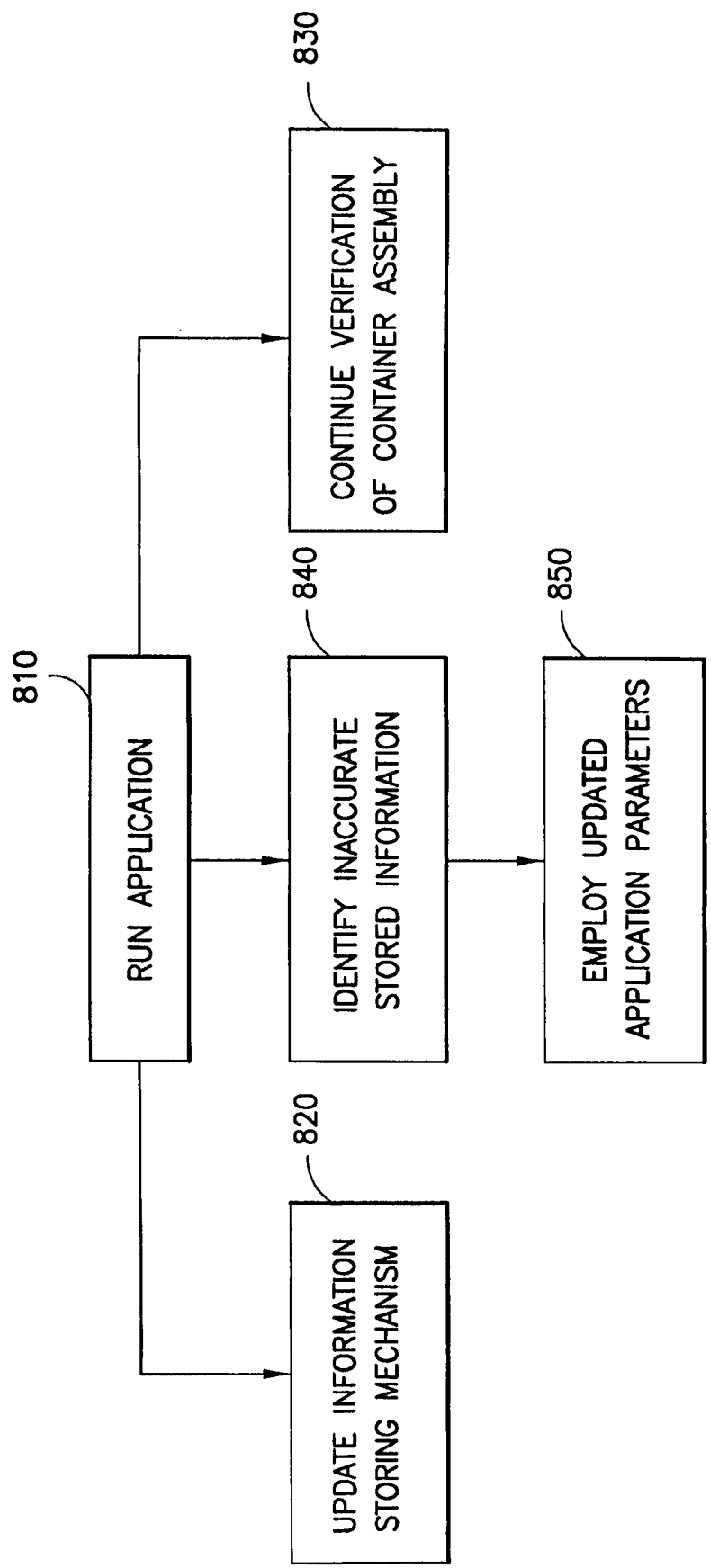

SECURE READER SYSTEM

BACKGROUND

Embodiments described relate to reader or tracking systems. In particular, embodiments relate to reader systems employing features to ensure secure and proper readings. Embodiments may also relate to features that account for changes in characteristics from one item being read or tracked to another.

BACKGROUND OF THE RELATED ART

In the fabrication of semiconductor devices, materials of varying purposes are deposited on a semiconductor substrate. The semiconductor substrate is often a wafer of monocrystalline silicon materials such as silicon dioxide. Materials deposited thereon may include copper, aluminum and other metals to form metal lines or other circuit features within trenches of the semiconductor substrate. Additional circuit features and material layers may be formed on the semiconductor substrate throughout the fabrication process.

In order to form trenches as described above, a photoresist material is first deposited above the semiconductor substrate. The manner of transport and delivery of the photoresist material to the semiconductor substrate may be critical to the fabrication process. For example, the cost of application of the wrong type of photoresist may be quite extreme. Such an error may cost in terms of a destroyed expensive semiconductor substrate, such as a circuit device wafer, wasted photoresist, and the downtime necessary to correct the error.

The photoresist material described above is transported and delivered to the surface of the semiconductor substrate in a liquid form. The photoresist material is applied and thinly spread across the semiconductor substrate surface generally by a spin-on process. Parameters of the spin-on process are selected to ensure a fairly uniform, thin distribution of the photoresist across the surface of the semiconductor substrate. This is often followed by application of heat to the semiconductor substrate resulting in the formation of a solid photoresist layer on the semiconductor substrate.

The solid photoresist layer described above may be patterned to allow for the formation of trenches therebelow by conventional etching techniques. However, proper trench formation and uniformity is dependent in part upon the degree of uniformity displayed by the thin photoresist layer defining the trenches. Indeed, proper transport and delivery of photoresist material to the semiconductor substrate is critical to the fabrication of a reliable semiconductor device. In fact, as device features, such as metal lines, become smaller and smaller, the adverse effect of photoresist non-uniformity on a device feature becomes magnified.

Achieving a uniformly thin photoresist layer may require application of a spin-on, or other process, which employs parameters based on the particular physical and functional characteristics of the photoresist material. Unfortunately, characteristics of a photoresist material type may vary from one batch to the next. For example, the viscosity of a photoresist type may vary from one batch or container to the next. Thus, establishing reliable predetermined parameters for forming an adequately uniform photoresist layer on a semiconductor substrate may be extremely difficult, if not impossible, to accomplish. Proper transport and application of photoresist material to the semiconductor substrate faces challenges related to both providing the proper type of photoresist material, and employment of the proper application parameters in light of precise characteristics of the photoresist material provided.

BRIEF DESCRIPTION OF THE DRAWINGS

FIG. 8 is a flow-chart summarizing additional methods of employing a reader system such as that of FIG. 1.

DETAILED DESCRIPTION

Embodiments are described below with reference to certain features of a secure reader system. In particular, features are described which help to ensure the reliability and security of a container assembly containing a photoresist material. Additionally, features are described which allow for seamless calibration of application parameters to ensure that any change in characteristics of a photoresist material type are accounted for when changing from one batch or container of photoresist material to the next.

Figure 1:
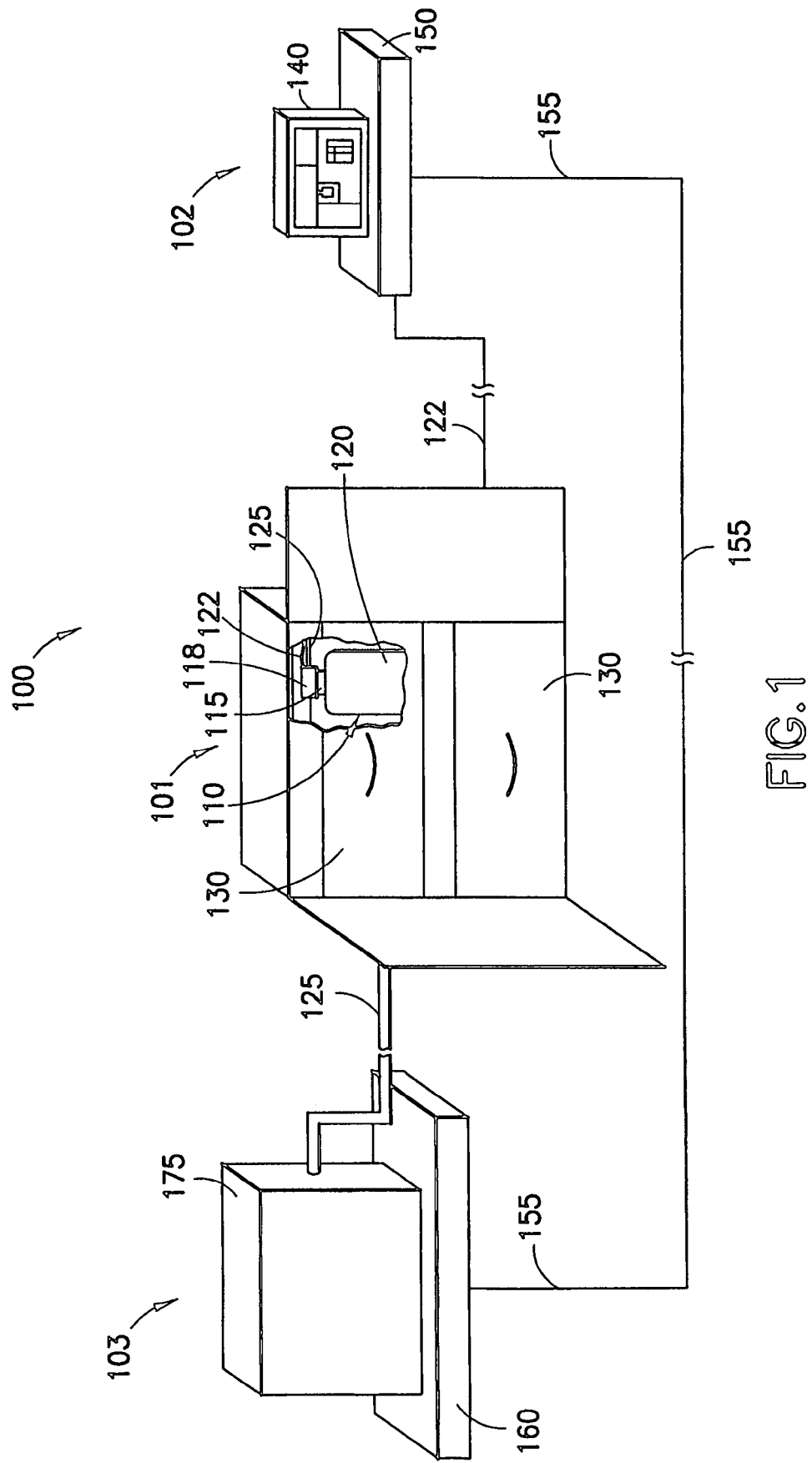
FIG. 1 is a sectional perspective view of an embodiment of a reader system.

Referring now to FIG. 1, an embodiment of a secure reader system (SRS) 100 is shown. The SRS 100 includes a material cabinet 101 for housing a container assembly 110. In the embodiment shown, only one container assembly 110 is visible. However, a plurality of container assemblies 110 may be included. Additionally, the material cabinet 101 may have multiple material drawers 130 as shown, to increase the number and types of container assemblies 110 which may be accommodated.

Figure 2:
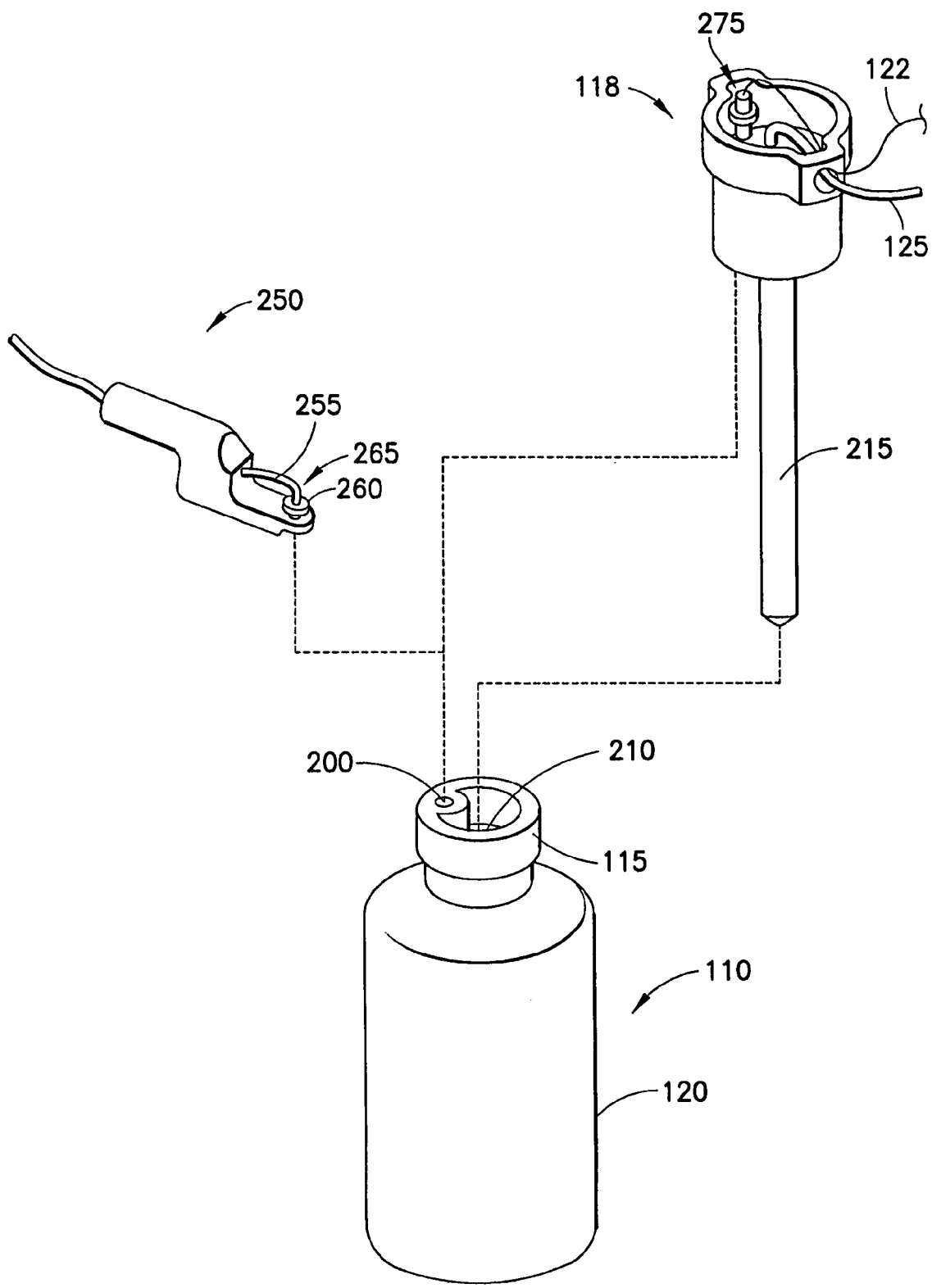
FIG. 2 is an exploded perspective view of an embodiment of a container assembly of the reader system of FIG. 1.

The container assembly 110 includes an information storing mechanism for storing information about a material contained therein, such as an information tag 200 (see FIG. 2). As shown in FIG. 1, a cap 115 is provided coupled to a container body 120. The information tag 200 is specifically located at the cap 115 in the embodiment shown. The cap 115 is configured to receive and secure a connector 118. The connector 118 in turn, is configured for simultaneously coupling the container assembly 110 to a process assembly 103 and a control unit 102 as described further below.

The container assembly 110 is configured to accommodate a material that is to be delivered to the process assembly 103. In the embodiment shown, the connector 118 is coupled to a process assembly 103 by way of a material line 125. Similarly, the connector 118 is coupled to the control unit 102. The control unit 102 is configured to identify and monitor the container assembly 110 as described further herein. An information cable 122 is provided for communication between the container assembly 110 and the control unit 102.

In the embodiment shown in FIG. 1, the control unit 102 includes a controller 150 directly coupled to the container assembly 110 and a touch screen monitor 140. The touch screen monitor 140 may display information directly related to the container assembly 110, or material therein, as described further herein. In addition to identifying and monitoring the container assembly 110, the control unit 102 may direct applications at the process assembly 103 which employ material contained by the container assembly 110.

Central processing capability is contained within the controller 150 and a controller cable 155 is provided to couple the process assembly 103 thereto. In this manner, applications employing material from a container assembly 110 may be directed by the control unit 102. For example, a user may direct such an application via the touch screen monitor 140. In certain embodiments, directing of such an application is based on information obtained from the information storing mechanism described above, and with reference to FIG. 2 below (see the information tag 200).

Continuing with reference to FIG. 1, the process assembly 103 includes a process chamber 175 coupled to a microprocessor 160. The microprocessor 160 may direct an application within the process chamber 175 based on a predetermined set of instructions or information from the controller 150. The process chamber 175 may contain a tool or equipment to employ material contained in the container assembly 110. For example, in one embodiment, the process chamber 175 includes a spin on tool 600 for application of a photoresist material 300 from the container assembly 110 to a semiconductor substrate 675 (see FIG. 6).

Referring now to FIG. 2, the container assembly 110 is shown in further detail. As described above, a connector 118 is coupled to the container assembly 110 at the cap 115. The cap 115 may include a rupturable membrane 210 to initially seal the contents of the container assembly 110. In such an embodiment, a probe 215 of the connector 118 may be used to penetrate the rupturable membrane 210 and provide communication between the material of the container assembly 110 and the connector 118. As described above, the connector 118 also includes an information cable 122 and a material line 125. The material line 125 couples to the probe 215 within the body of the connector 118. The information cable 122 terminates at an antenna assembly 275 described further below.

Figure 7:
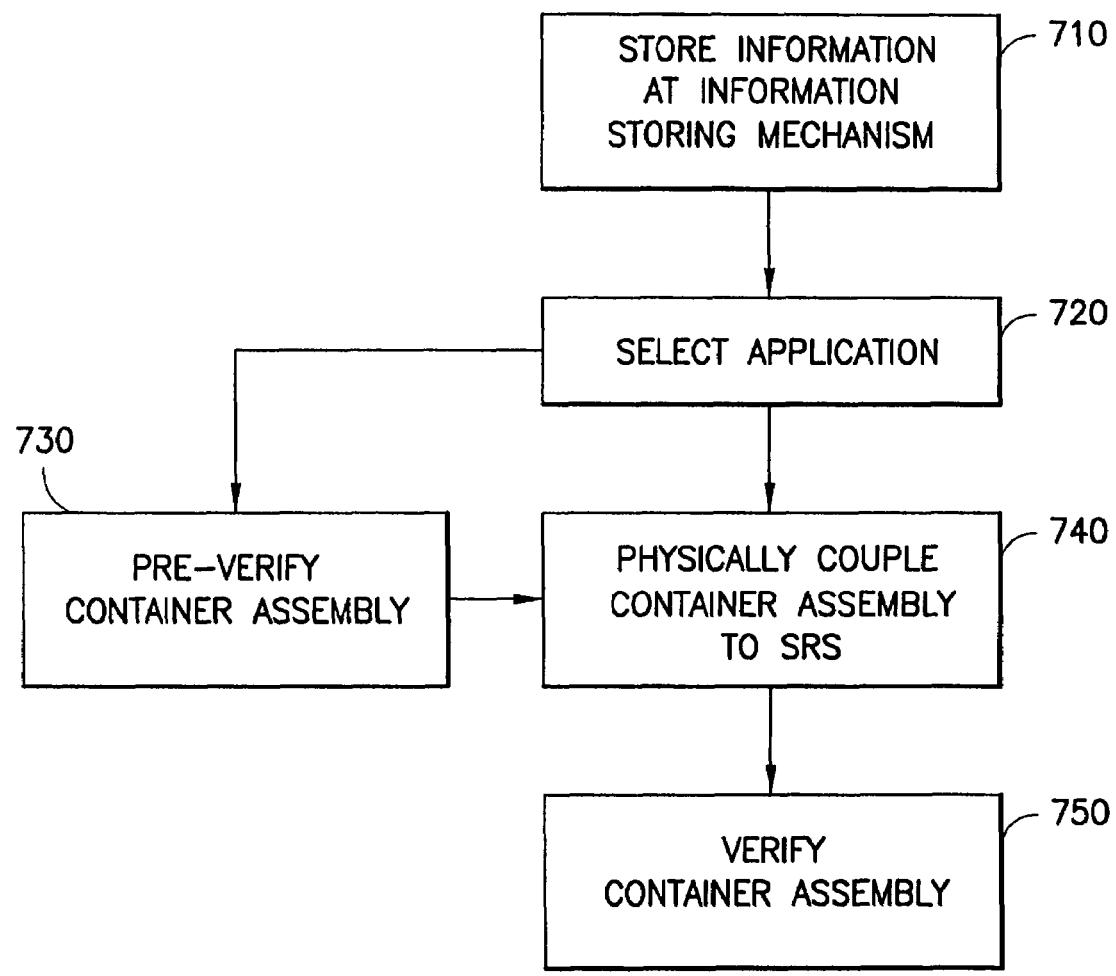
FIG. 7 is a flow-chart summarizing methods of employing a reader system such as that of FIG. 1.

With additional reference to FIGS. 7 and 8, embodiments of employing an SRS 100 as shown in FIG. 1 are summarized in the form of flow-charts. FIGS. 7 and 8 are referenced throughout portions of the description to follow as an aid in describing how features of the SRS 100 may interact during use.

As also described above, the cap 115 of the container assembly 110 also includes an information tag 200 as the information storing mechanism. The information tag 200 is configured to hold data regarding the material contained by the container assembly 110. For example, in one embodiment, data regarding the material's properties, date and conditions of manufacture, amount, and other characteristics are stored at the information tag 200 (see 710 of FIG. 7).

The information tag 200 may be a bar code, magnetic strip, radio frequency identification (RFID) device employing electronically erasable programmable read only memory (EEPROM), or any other conventional mechanism suitable for storing information regarding material contained within the container assembly 110. In one embodiment, the information tag 200 includes EEPROM to increase the amount of data which may be stored at the information tag 200. In this embodiment, the data may be updated as indicated at 820 of FIG. 8, by writing to the information tag 200 as the material within the container assembly 110 changes (e.g. as the material amount decreases due to use in an application).

Figure 3:
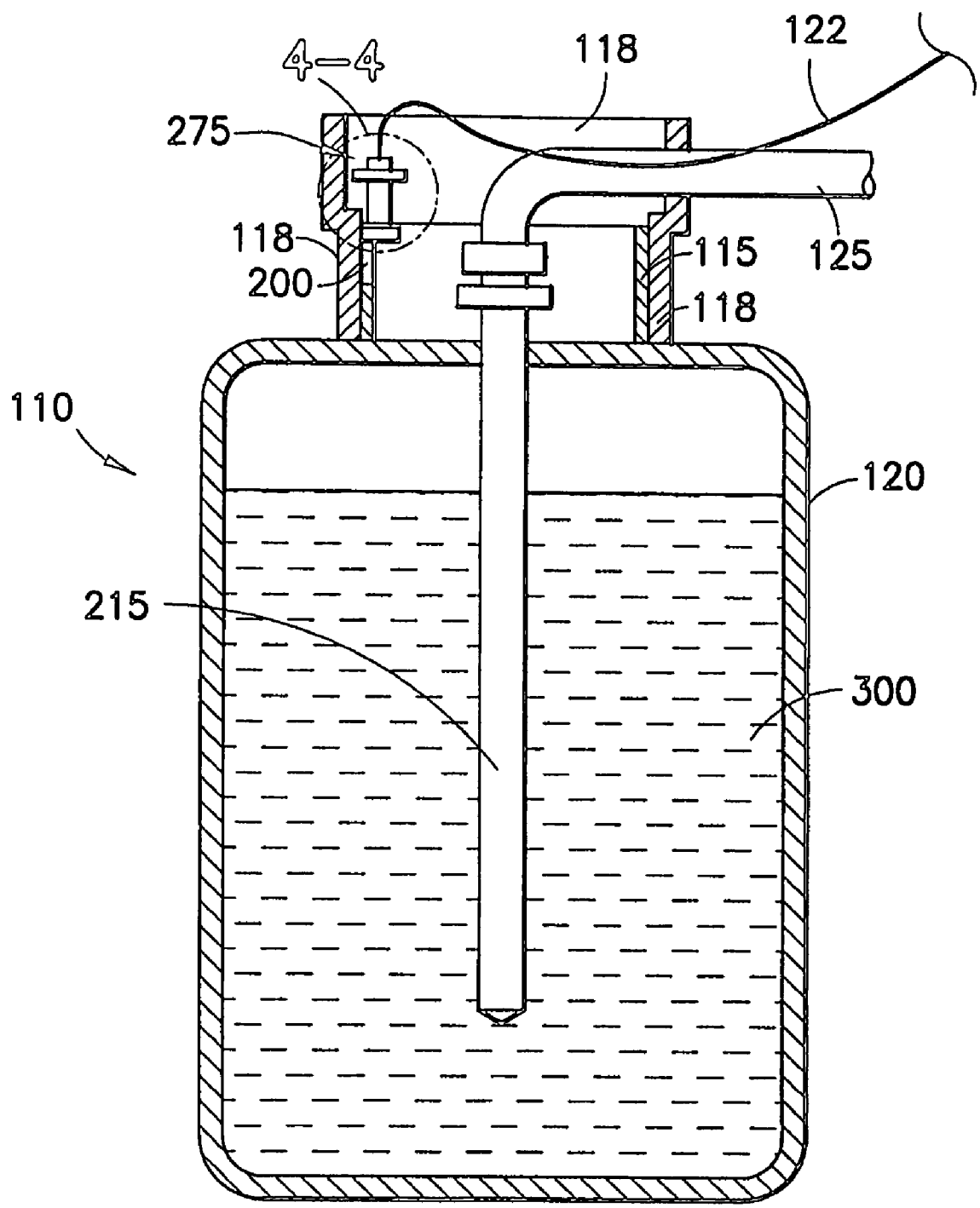
FIG. 3 is a cross-sectional view of the container assembly of FIG. 2.

Continuing with reference to FIGS. 2 and 3, the container assembly 110 may contain a photoresist material 300 for use in a particular application. The connector 118 includes features to ensure that the proper photoresist material 300 and container assembly 110 with proper photoresist material 300 is coupled to the connector 118 for use in the application.

The information cable 122 terminates at an antenna assembly 275 as noted. The connector 118 may be physically coupled to the cap 115, with the probe 215 in the container body 120 and antenna assembly 275 adjacent the information tag 200. Once positioned in this manner, the antenna assembly 275 may read information from the information tag 200 at the cap 115. In one embodiment, the antenna assembly 275 is prevented from reading information until the type of coupling described here, between the connector 118 and the cap 115, is employed. Information read by the antenna assembly 275 may be associated exclusively with the container assembly 110 due to the manner in which the connector 118 is physically secured and positioned at the container assembly 110. Thus, the connector 118 acts as a single pathway through which both material, in the container assembly 110, and information from the information tag 200, may pass.

To further ensure that the proper material and container assembly 110 are coupled to the connector 118 for a desired application, a verification tool 250 may be employed prior to coupling the connector 118 to the cap 115 of the container assembly 110. The verification tool 250 includes a verification cable 255 coupled to the controller 150 (see FIG. 1). The verification cable 255 terminates at a verification antenna 265 for reading information from the information tag 200. The verification antenna 265 includes a verification indicator 260, such as visible light emitting diodes (LEDs) or other suitable mechanisms.

With additional reference to FIG. 7, an application is selected at the control unit 102 (see FIG. 1). As indicated at 730, the verification antenna 265 of the verification tool 250 may be placed adjacent the information tag 200 and directed by the controller 150 (see FIG. 1) to read information from the information tag 200. The verification indicator 260 may then provide a visible response to the information read by the verification antenna 265. For example, in one embodiment, the verification indicator 260 may emit a green light when the information read from the information tag 200 indicates that an acceptable material 300 and container assembly 110 are present for a given application. Alternatively, the verification indicator 260 may emit a red light when the information from the information tag 200 indicates otherwise. In this manner, the photoresist material 300 and container assembly 110 may be verified before coupling of the connector 118 to the cap 115 of the container assembly 110.

Figure 5:
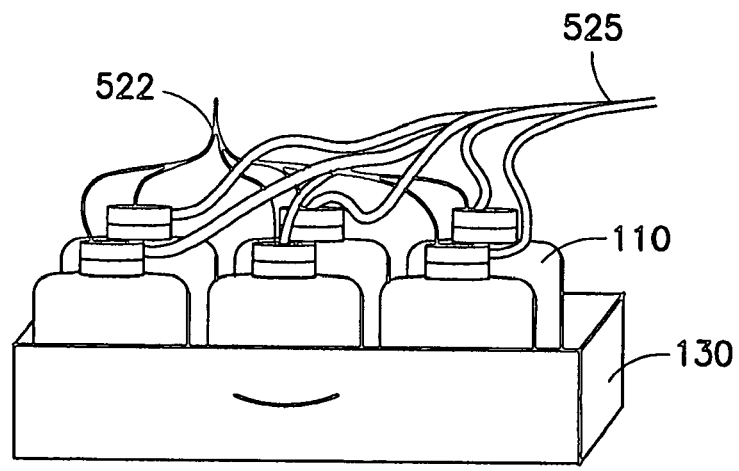
FIG. 5 is a perspective view of an embodiment of a cabinet drawer of the reader system of FIG. 1 and including a plurality of container assemblies.

In the embodiment shown, verification, as described above, prevents rupturing of the rupturable membrane 210 and exposure of the photoresist material 300 in order to verify the container assembly 110 and photoresist material 300 for use in a desired application. Additionally, the verification indicator 260 may elicit a visible response from the antenna assembly 275 as directed by the controller 150. This may include visible responses from multiple antenna assemblies 275 simultaneously, such as at a material drawer 130 as shown in FIG. 5.

With reference to FIG. 3, the container assembly 110 is physically secured to the SRS 100 of FIG. 1 as indicated at 740 (see FIG. 7). This is achieved through the coupling of the connector 118 to the cap 115. The probe 215 extends down into the container body 120 and into contact with the material. As shown, the connector 118 is properly secured to the container assembly 110 such that a fluid (e.g. photoresist material 300) may be drawn or pumped from the container body 120 through the probe 215 and into the material line 125 by conventional means.

The connector 118 is simultaneously secured to the cap 115 in a manner that also allows information from the information tag 200 to be read by the antenna assembly 275. The connector 118 is secured in this manner ensuring that it is ready to draw photoresist material 300 from the container assembly 110 at the same time the information may be transferred from the information tag 200 to the antenna assembly 275. This physically eliminates the possibility of the antenna assembly 275 reading information from any source other than the information tag 200 of the very container assembly 110 that is simultaneously in communication with the connector 118. For example, this prevents users from obtaining information from the information tag 200 of one usable container assembly 110 and photoresist material 300 only to later mistakenly couple a different unusable container to the connector 118 for an application.

Referring to FIG. 3, a container assembly 110 is shown with the connector 118 assembled thereto. The probe 215 extends into the container body 120 for withdrawal of photoresist material 300 to the material line 125 for use in an application. The probe 215 may extend vertically into the container body 120 as shown. Alternatively, the probe 215 may be configured of differing shapes or lengths to ensure that photoresist material 300 is drawn from the lowermost portion of the container body 120. When the connector 118 is secured as shown, at the cap 115, the antenna assembly 275 rests adjacent the information tag 200. Information may be exchanged between the information tag 200 and the antenna assembly 275 as described above, and transferred along the information cable 122. Thus, physical coupling of the proper container assembly 110 may be verified as indicated at 750 before an application is run as indicated at 810 (see FIGS. 7 and 8).

Figure 4:
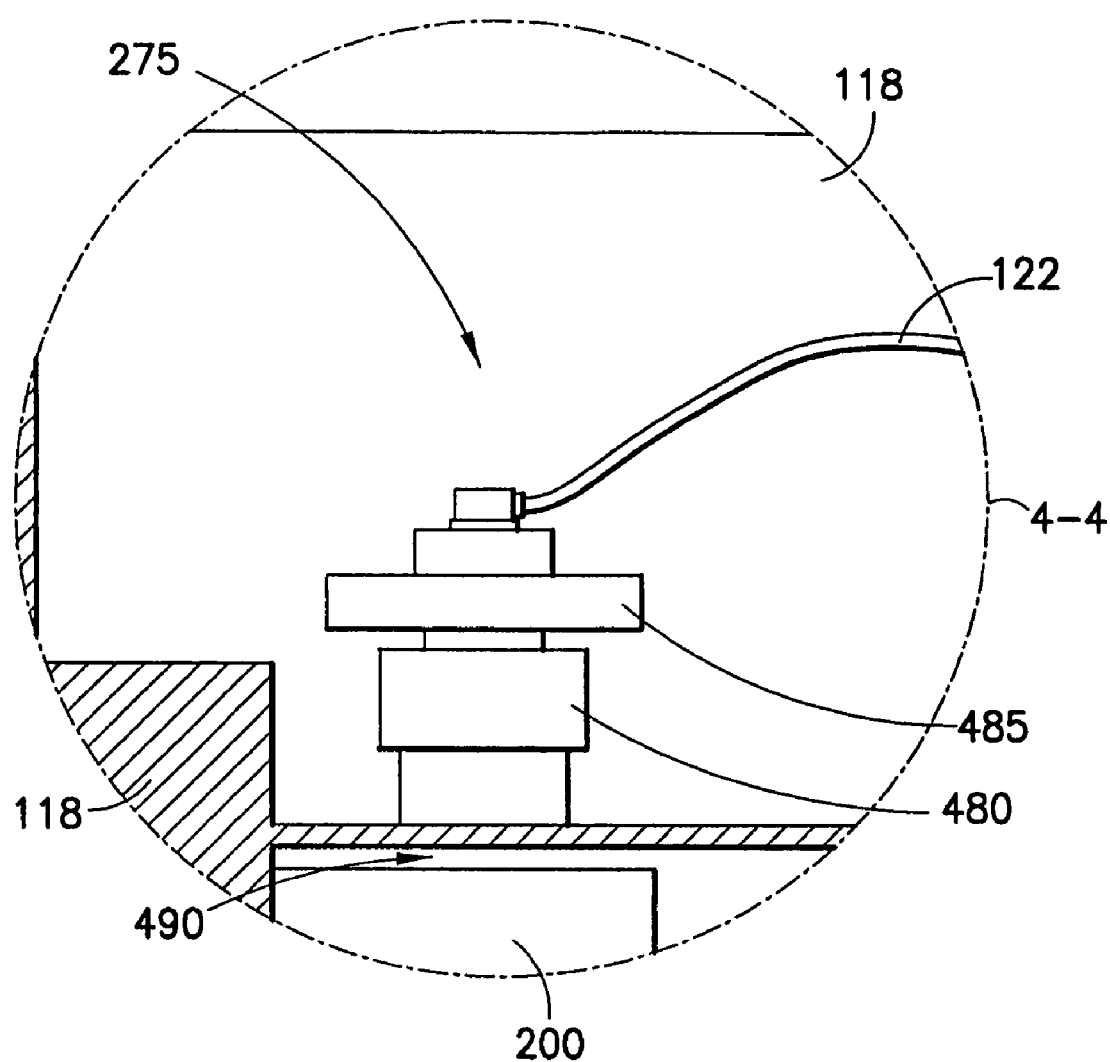
FIG. 4 is a magnified view of an antenna of the container assembly taken from 4-4 of FIG. 3.

With reference to FIGS. 3 and 4, the antenna assembly 275 is shown having an antenna portion 480 and an antenna indicator 485. The antenna portion 480 may be a conventional antenna to read information from the information tag 200. Physical coupling between the antenna portion 480 and the information tag 200 is not required. In the embodiment shown, a minimal clearance 490 is provided between the information tag 200 and the antenna portion 480 when the connector 118 is properly secured to the cap 115. A lack of physical contact between the information tag 200 and the antenna portion 480 helps preserve the integrity of the information tag 200 and the antenna portion 480.

The antenna portion 480 may serve to read information from the information tag 200. The antenna indicator 485 may include LED features configured to light up based on the information obtained from the information tag 200. For example, in one embodiment, the antenna indicator 485 may emit a green light when the information read from the information tag 200 indicates that an acceptable photoresist material 300 and container assembly 110 are present for a given application. Alternatively, the antenna indicator 485 may emit a red light when the information from the information tag 200 indicates otherwise. This may provide further assurance to the user that the proper container assembly 110 is being employed before an application is run making use of the photoresist material 300.

Continuing with reference to FIGS. 1-4, the exchange of information between the information tag 200 and the antenna assembly 275 may be directed by the controller 150. The controller 150 may also direct the application to be employed as described above. Therefore, in one embodiment, the determination of whether a particular container assembly 110 is acceptable for a particular application is based on a predetermined set of criteria stored in the controller 150. When an unacceptable container assembly 110 is coupled to the connector 118, the controller 150 may indicate such at the antenna indicator 485 as described above. Additionally, the controller 150 may respond by terminating the application before photoresist material 300 is drawn from the container body 120.

In addition to directing the application based on readings obtained from the information tag 200, the controller 150 may also direct that readings take place on a continuous or ongoing basis as indicated at 830 of FIG. 8. Ongoing readings may be used to prevent replacement of an acceptable container assembly 110 between applications without detection. In a preferred embodiment, readings take place in millisecond intervals. However, readings may also take place in alternate intervals. For example, in one embodiment, readings are obtained by the antenna portion 480 in intervals which are less than an estimated duration of the application. This ensures multiple readings by the antenna portion 480 before change out of the container assembly 110. Thus, even where an acceptable container assembly 110 is coupled to the connector 118 and an application immediately run, there is not enough time to subsequently couple an unacceptable container to the connector 118 without detection. In a further embodiment, the readings are obtained in intervals which are less than an estimated container change-out time (i.e. the time necessary to change out a container assembly 110). This ensures multiple readings by the antenna portion 480 before change out of the container assembly 110 even where no application has yet been run. For example, in an embodiment where change out of the container assembly 110 physically requires more than 5 seconds of the users time, readings may be taken in intervals of no more than about 5 seconds.

Continuing with reference to FIGS. 1-4, the antenna assembly 275 may be configured to write updated information to the information tag 200 as indicated at 820 of FIG. 8. For example, as noted above, the information tag 200 may include radio frequency identification (RFID) capacity. Therefore, information regarding the amount of material 300 in the container assembly 110 may be stored in the information tag 200. In one embodiment, as a quantity of material 300 is drawn from the container assembly 110 during an application, information regarding the amount of photoresist material 300 in the container assembly 110 may be updated. This updating is obtained by the antenna assembly 275 writing new information to the information tag 200 accounting for the quantity of photoresist material 300 drawn during the application. Therefore, up to date information regarding the amount of photoresist material 300 remains with the container assembly 110. Thus, the container assembly 110 may be removed from the SRS 100 or used with a different system without losing information regarding the amount of photoresist material 300 in the container assembly 110.

Referring to FIGS. 1 and 5, a container assembly 110 is shown in a material drawer 130 of the SRS 100. The material drawer 130 holds several such assemblies for use in a variety of possible applications to be directed by the controller. This user-friendly capacity also provides the SRS 100 with built in efficiency.

Figure 6:
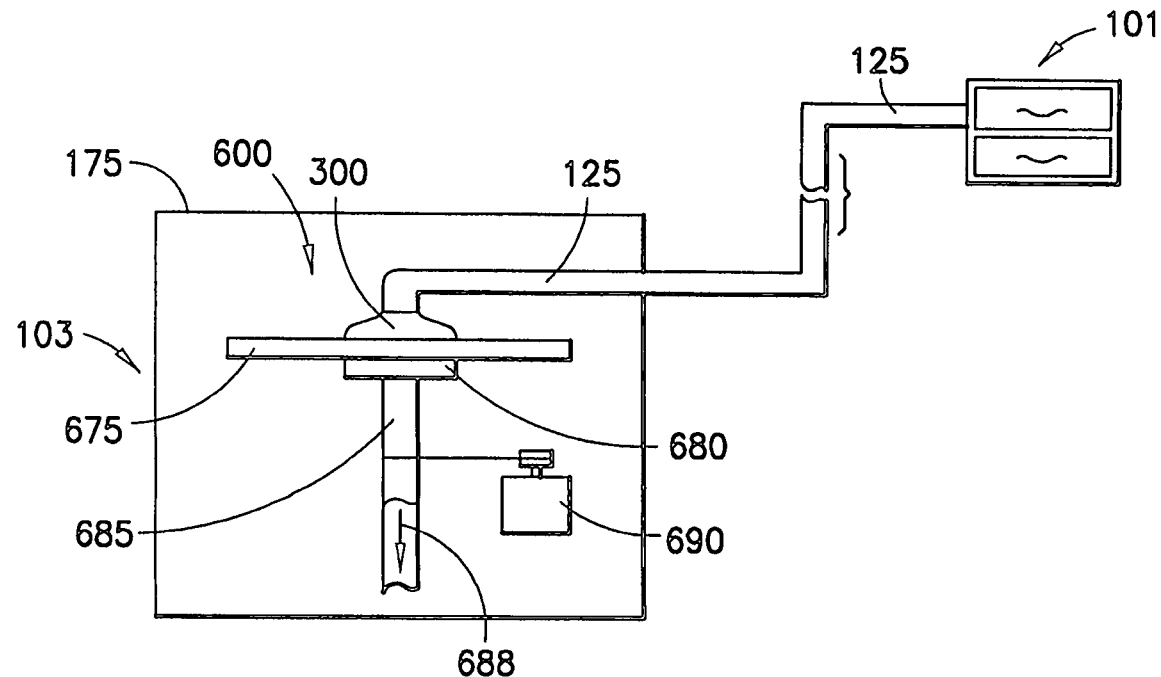
FIG. 6 is a sectional view of the process assembly of FIG. 1 revealing a spin-on tool.

Referring to FIG. 6, the process assembly 103 of FIG. 1 is shown in greater detail. In the embodiment shown, the process assembly 103 includes a process chamber 175 wherein a spin-on tool 600 is provided. The spin-on tool 600 is configured to receive and distribute photoresist material 300 across the surface of a semiconductor substrate 675. In other embodiments, the process chamber 175 may include tools for alternate techniques of distributing material, such as meniscus coating, stencil printing, or applications unrelated to photoresist distribution.

As shown in FIG. 6, a semiconductor substrate 675 is centrally positioned atop a rotable platform 680 of the spin-on tool 600. The rotable platform 680 is supported by a pipe 685 having a hallowed out portion 688 that terminates adjacent the semiconductor substrate 675. In this manner, a vacuum (shown by arrow 688) may be applied through the pipe 685 by conventional means to secure the semiconductor substrate 675 as shown.

With reference to FIGS. 1 and 6, a rotable motor 690 is shown coupled to the pipe 685 for rotating the spin-on tool 600 as a photoresist material 300 is delivered to the surface of the semiconductor substrate 675. The photoresist material 300 is delivered from the material line 125 and cabinet 101 as directed by the controller 150. The controller 150 directs the described application through the microprocessor 160 according to functional properties of the photoresist material 300. Such functional property information is obtained from the container assembly 110 as described above.

In one embodiment, the photoresist material 300 is an i-line photoresist, such as a novolak resin and a phenolic compound in a propylene glycol monomethyl ether acetate (PGMEA) solvent. The phenolic compound may be a diazonaphtha quinone derivative. The controller 150, by way of the microprocessor 160, directs spinning of the spin-on tool 600 at between about 4,000 rpm and about 5,000 rpm as the photoresist material 300 is delivered. The semiconductor substrate 675 is then exposed to a temperature of between about 90° C. and about 100° C. for between about 25 seconds and about 35 seconds. A film of photoresist material 300 is thus provided on the semiconductor substrate 675. The resulting film may have a thickness of between about 1.0 microns and about 1.4 microns.

In other embodiments, similar but alternative parameters may be employed to provide alternate films of photoresist material 300 having different thicknesses. For example, in one embodiment a deep ultraviolet (UV) photoresist film may be provided having a thickness of between about 0.6 microns and about 1.0 microns. In another embodiment, a 193 nm photoresist, similar in character to a deep UV photoresist, may be provided having a thickness of between about 0.6 microns and about 0.8 microns.

The above described applications proceed based in part on information stored at the container assembly 110. However, in certain situations the information may not be entirely accurate. In the embodiments described here this may lead to the film thickness deviating from a desired range or other distribution problems. For example, there may be a change in viscosity from one batch or container of photoresist to the next that is unaccounted for at the time information is originally stored at the container assembly 110. As shown in FIG. 8, the presence of inaccurate information may be identified 840 by conventional means and the application revised to employ updated parameters 850. That is, parameters of the application may be changed by entering updated information through the control unit 102. In the embodiment shown, this requires only indicating the undesired film thickness obtained at the touch screen 140. Algorithmic adjustments accounting for the disparity may be made by the controller 150 and immediately applied to applications employing the photoresist material 300. The SRS 100 is configured in a manner that allows such seamless calibrations. This results in minimal down time and improved throughput when running such applications.

In yet another embodiment, information obtained from an information storing mechanism may be used dynamically. For example, in situations where material properties, such as viscosity, change over time, information stored at the information storing mechanism may relate to the age of the material or its viscosity at a given point in time. When running an application such information may be accounted for in an automated manner. For example, where the controller 150 has known viscosity rate change information stored therein (see FIG. 1), algorithmic values may be established automatically in a manner that accounts for the viscosity of the material at the precise time of the application.

Embodiments described above provide a secure manner of ensuring that a particular given material is exclusively made available for a given application. Embodiments are also described which provide a user-friendly and seamless manner of verifying and, if necessary, updating application parameters for which the material is to be employed.

While the above embodiments are described with reference to particular semiconductor photoresist applications other embodiments and features may be employed. For example, embodiments may be directed at spin on dielectric applications. Additionally, a system such as that described above may be configured for applications employing gas containers, blood bags, biopharmaceutical containers, drug delivery devices, and containers containing one of a variety of material types including returnable and reusable containers. A reusable container may even employ an information mechanism having new material information written thereon for each subsequent use of the container with new material therein. Embodiments described may be of particular benefit where material characteristics are prone to vary for example, from one container or batch to the next. Additionally, various other features and methods may be employed which are within the scope of the described embodiments.

We claim:

1. A container assembly comprising:
   a container body having an interior for containing a material;
   an information storing element coupled to a portion of said container body and for storing information about the material, the portion configured to couple to a removable connector defining a material passage and adapted to receive said information; and
   a verification tool adapted to receive said information from the information storing element prior to coupling of said connector to said portion of said container body, wherein said information is used to dictate whether the connector should be coupled to said portion of the container body.

2. The container assembly of claim 1 wherein said portion of said container body comprises a cap for sealing said container body.

3. The container assembly of claim 1 wherein the information comprises any of: a property of said material, date of manufacture of said material, condition of manufacture of said material, and an amount of said material.

4. The container assembly of claim 1 wherein the material is one of an i-line, deep ultraviolet and a 193 nm photoresist.

5. The container assembly of claim 1 wherein the connector is simultaneously coupled to a process assembly to employ the material in an application and a control unit to direct the application.

6. A cap adapted (i) for removable coupling to a container having an interior for containing a material, (ii) following coupling of said cap to said container, for removable coupling to a connector having an information retrieval element for receiving an information-containing signal and a material conduit permitting access to the interior; and (iii) for receiving a verification tool, said cap comprising an information storing element for storing information about said material, wherein said verification tool is adapted to receive at least a portion of said information from the information storing element prior to coupling between the connector and the cap, and is adapted to use said received information in verifying whether the connector should be coupled to the cap.

7. The cap of claim 6 wherein the information storing element comprises an information tag in the form of any of a bar code, a magnetic strip, and a radio frequency identification device.

8. The cap of claim 6 further comprising a rupturable membrane to seal the interior and for rupturing to allow the connector to access the interior.

9. A system comprising:
a container having an interior for containing a material;
an information storage element for storing information about the material;
a process assembly to employ the material in an application;
a control unit to direct the application based on said information about the material;
a verification tool coupled to the control unit and having a first information retrieval element adapted to communicate with the information storage element; and
a connector removably coupleable to said container, and coupleable to said process assembly and said control unit, said connector having a material conduit to provide said process assembly with access to the material and having a second information retrieval element adapted to communicate with the information storage element to provide said control unit with access to the information;
wherein said verification tool is adapted to communicate with the information storage element prior to coupling between said connector and said container, and further adapted to utilize a signal obtained by said communication to determine whether said connector should be coupled with said container.

10. The system of claim 9 wherein said process assembly includes a tool for any of spin-on coating, meniscus coating, and stencil printing of the material onto a semiconductor substrate.

11. The system of claim 9 further comprising a material cabinet for housing said container.

12. The system of claim 9 wherein said connector is coupled to said container at a cap having a membrane for rupturing to allow said connector to provide said process assembly with the access to the material, wherein information received by the verification tool is used to determine whether the membrane should be ruptured.

13. A system comprising:
a control unit for coupling to a process assembly adapted to employ a material in an application, the material being disposed in a container having an electronic information storage element containing information about the material;
a verification tool comprising a first information retrieval element coupleable to the control unit and adapted to receive at least a first portion of said information from the electronic information storage element; and
a connector defining a material conduit for extracting material from the container and being removably coupleable to the container, the connector comprising a second information retrieval element coupleable to the control unit and adapted to receive at least a second portion of said information from the electronic information storage element, wherein said at least a second portion of said information is useable to dictate a manner in which the material should be utilized by the process assembly;
wherein said verification tool is adapted to receive said at least a first portion of said information prior to coupling between the container and the connector and to utilize said at least a first portion of said information to determine whether said connector should be coupled with said container; and
wherein said control unit directs the process assembly based on said information about the material.

14. A method utilizing a container containing a material, the method comprising:
reading, from an electronic storage element associated with the container, information about the material and utilizing said information, prior to coupling to the container a connector adapted for material extraction and information retrieval, to verify the propriety of coupling the connector to the container;
coupling said connector to the container after said verifying;
reading information about the material from the container via the connector; and
withdrawing the material from the container through the connector.

15. The method of claim 14 wherein the material comprises any of a dielectric, photoresist, gas, blood, and a pharmaceutical.

16. The method of claim 15 further comprising reusing the container following the withdrawing.

17. The method of claim 15 further comprising updating the information following the withdrawing.

18. The method of claim 15 further comprising running an application based on the information.

19. The method of claim 18 wherein said reading is ongoing in intervals less than at least one of an estimated duration of the application, an estimated container change-out time, and about five seconds.

20. The method of claim 18 wherein a parameter of the application is subject to change based on the information, and such parameter is established based at least in part on a date or time of said withdrawing of the material or said running of the application.

21. The method of claim 18 further comprising:
identifying inaccuracy of the information; and
adjusting at least one parameter of the application based on the inaccuracy.

22. The method of claim 21 wherein said adjusting comprises entering a result of the inaccuracy at a controller for directing the application, the controller to provide said adjusting in an automated manner based on said entering.

23. The container assembly of claim 1, wherein the information storing element comprises a radio frequency identification tag, the verification tool comprises a first antenna, and the connector comprises a second antenna.

24. A system comprising the container assembly of claim 1, a process tool, and a control unit adapted to control the process tool, the control unit being communicatively coupled to both the connector and the verification tool.

25. The system of claim 9, wherein the information storage element comprises a radio frequency identification tag, the first information retrieval element comprises a first antenna, and the second information retrieval element comprises a second antenna.

26. The system of claim 9, wherein the connector comprises an elongated probe defining the material conduit, wherein the probe is insertable into the interior of the container.

27. The system of claim 13, wherein the electronic information storage element comprises a radio frequency identification tag, the first information retrieval element comprises a first antenna, and the second information retrieval element comprises a second antenna.

28. The method of claim 15, wherein said first reading step is performed with a verification tool coupled to a control element adapted to control the withdrawing.

* * * * *

UNITED STATES PATENT AND TRADEMARK OFFICE
CERTIFICATE OF CORRECTION

| | | |
|---|---|---|
| PATENT NO. | : 7,702,418 B2 | Page 1 of 1 |
| APPLICATION NO. | : 10/742125 | |
| DATED | : April 20, 2010 | |
| INVENTOR(S) | : Kevin T. O'Dougherty | |

It is certified that error appears in the above-identified patent and that said Letters Patent is hereby corrected as shown below:

On the Title Page, after Item (65) and associated text, and prior to Item (51), please insert the following:

--(63) Related U.S. Application Data
Continuation-in-part of application No. 09/880,472, filed on June 13, 2001, now Patent No. 6,879,876.--

At column 1, after the title, "SECURE READER SYSTEM", and before the heading "BACKGROUND", please insert the following heading and paragraph:

--CROSS-REFERENCE TO RELATED APPLICATION

This is a continuation-in-part of U.S. Patent Application No. 09/880,472, entitled "Liquid Handling System With Electronic information Storage" filed on June 13, 2001, and subsequently issued as U.S. Patent 6,879,876 on April 12, 2005, in the names of Kevin T. O'Dougherty and Robert E. Andrews.--

Signed and Sealed this
Sixteenth Day of October, 2012

David J. Kappos
*Director of the United States Patent and Trademark Office*